United States Patent
Dubois et al.

(10) Patent No.: US 7,229,934 B2
(45) Date of Patent: Jun. 12, 2007

(54) POROUS ORGANOSILICATES WITH IMPROVED MECHANICAL PROPERTIES

(75) Inventors: Geraud Dubois, Palo Alto, CA (US); James Hedrick, Pleasanton, CA (US); Ho-Cheol Kim, San Jose, CA (US); Victor Lee, San Jose, CA (US); Teddie Magbitang, San Jose, CA (US); Robert Miller, San Jose, CA (US); Eva Simonyi, Bronx, NY (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/031,418

(22) Filed: Jan. 7, 2005

(65) Prior Publication Data

US 2006/0084282 A1  Apr. 20, 2006

Related U.S. Application Data

(60) Provisional application No. 60/619,706, filed on Oct. 18, 2004.

(51) Int. Cl.
*H01L 21/31* (2006.01)
*H01L 21/469* (2006.01)

(52) U.S. Cl. .............................. 438/781; 257/E21.494; 438/782

(58) Field of Classification Search ............... 438/781, 438/782, 778; 427/397.7; 257/E21.494
See application file for complete search history.

(56) References Cited

U.S. PATENT DOCUMENTS

| 5,895,263 | A | 4/1999 | Carter et al. |
| 6,399,666 | B1 | 6/2002 | Hawker et al. |
| 2003/0077918 | A1* | 4/2003 | Wu et al. ................... 438/781 |
| 2003/0232137 | A1* | 12/2003 | Vrtis et al. ............... 427/248.1 |
| 2004/0130032 | A1* | 7/2004 | Gronbeck et al. .......... 257/759 |
| 2004/0145030 | A1* | 7/2004 | Meagley et al. ............ 257/642 |
| 2004/0185679 | A1* | 9/2004 | Ott et al. .................... 438/781 |
| 2005/0045206 | A1* | 3/2005 | Smith et al. .................. 134/16 |

OTHER PUBLICATIONS

G. Fritz, Angew Chem. Int. Ed. Engl. 26 (1987), 1111-1132.
R.G. Jones et al. (eds.); "Silicon-Containing Polymers", Chapter 10, Polycarbosilanes L.V. Interrante, et al; (2000) Kluwer Academic Publishers, Boston 2000, p. 247-249; 316-321.

* cited by examiner

*Primary Examiner*—Caridad Everhart
(74) *Attorney, Agent, or Firm*—Rademaker Nugent & Affleck; Theresa O'Rourke Nugent

(57) ABSTRACT

Oxycarbosilane materials make excellent matrix materials for the formation of porous low-k materials using incorporated pore generators(porogens). The elastic modulus numbers measured for porous samples prepared in this fashion are 3–6 times higher than porous organosilicates prepared using the sacrificial porogen route. The oxycarbosilane materials are used to produce integrated circuits for use in electronics devices.

47 Claims, 2 Drawing Sheets

POROUS ORGANOSILICATES WITH IMPROVED MECHANICAL PROPERTIES

CROSS-REFERENCE TO RELATED APPLICATIONS

The present invention claims benefit of U.S. Provisional Application No. 60/619,706, filed on Oct. 18, 2004, the entire contents of which are hereby incorporated herein by reference.

BACKGROUND OF THE INVENTION

1. Field of the Invention

The present invention relates to an insulative material useful in microcircuitry applications, to a process of using the insulative material to prepare an integrated circuit, and to the integrated circuit obtainable thereby.

2. Description of Related Art

Low-k dielectric insulators are needed for, among other things, copper back-end-of-the-line (BEOL) on chip wiring in order to improve chip performance by minimizing crosstalk and capacitive coupling. The latter leads to substantial delays in signal propagation which becomes exacerbated as wiring dimensions decrease and densities increase. The difficulty of introducing any new material places a premium on dielectric extendibility, i.e., the use of materials with similar elemental compositions but with different dielectric constants for multiple device generations. The only true dielectric extendibility comes from the introduction of porosity. The introduction of porosity, while good for the reduction of dielectric constants, negatively impacts many other important material properties (electrical, thermal, mechanical).

Mechanical issues are particularly important for organosilicates, including chemical vapor deposition (CVD) and spin-on (SO) materials, which are intrinsically brittle materials and prone to cracking. Since organosilicates constitute, by far, the largest class of materials under consideration, mechanical issues move to the forefront because of concerns about reliability. The mechanical properties of these insulating materials are further compromised by the introduction of porosity to lower the dielectric constant. The mechanical properties of organosilicates have been addressed with limited success by variation in resin and/or porogen structures, control of porous morphologies and post porosity treatment using UV or e-beam exposure, usually at elevated temperatures. E-beam exposure has been shown to cause front end damage. For this reason, UV treatment of porogen/matrix nanohybrids or porous films generated by thermal calcination has become the method of choice for improving mechanical properties such as modulus and hardness.

Although improvements in modulii of 25–50% are sometimes achieved upon UV exposure, this requires a separate processing step and chemical changes are produced in the materials, which can degrade the electrical properties. Also, improved UV-efficiencies require specialized matrices and/or porogens for materials where the porosity is generated from sacrificial porogens. Although matrix structural modification can lead to improved modulii, this often occurs at the expense of dielectric constant, which, in turn, requires the addition of more porogen to achieve the dielectric target.

U.S. Pat. No. 5,895,263 describes a process for preparing an integrated circuit device comprising depositing a dielectric material comprising porous organic polysilica and a sacrificial porogen comprising a decomposable polymer onto a substrate. The entire contents of U.S. Pat. No. 5,895,263 are hereby incorporated by reference.

There still remains a need in the art to discover other materials that provide excellent dielectric properties without sacrificing mechanical properties.

SUMMARY OF THE INVENTION

This and other objects were met with the present invention, which relates, in a first embodiment, to an insulative material for use in microcircuit applications, said material comprising:

a) a dielectric material formed of an oxycarbosilane; and b) a decomposable polymer;

wherein, upon heating, said dielectric material condenses and said decomposable polymer decomposes and leaves a plurality of pores in the condensed dielectric material.

In a second embodiment, the present invention relates to an integrated circuit obtainable from said insulative material, the integrated circuit comprising:

a) a substrate;

b) a lithographically patterned porous dielectric oxycarbosilane surface film layer on said substrate; and c) a planarized metallic film on said surface layer.

In a third embodiment, the present invention relates to a process for preparing the integrated circuit from the insulative material, the process comprising the following steps:

a) positioning on a substrate a layer of an insulative matrix material precursor composition, said precursor composition comprising:

i) a dielectric material formed of an oxycarbosilane; and ii) a porogen comprising a decomposable polymer;

b) heating the precursor composition to condense the oxycarbosilane;

c) decomposing the decomposable polymer to form a condensed porous dielectric material film layer;

d) lithographically patterning the dielectric material film layer to form a patterned surface layer;

e) depositing a metallic film onto the patterned surface layer; and f) planarizing the metallic film to form the integrated circuit.

BRIEF DESCRIPTION OF THE DRAWINGS

The invention will now be described in greater detail with reference to the drawings, wherein.

Figure 1:
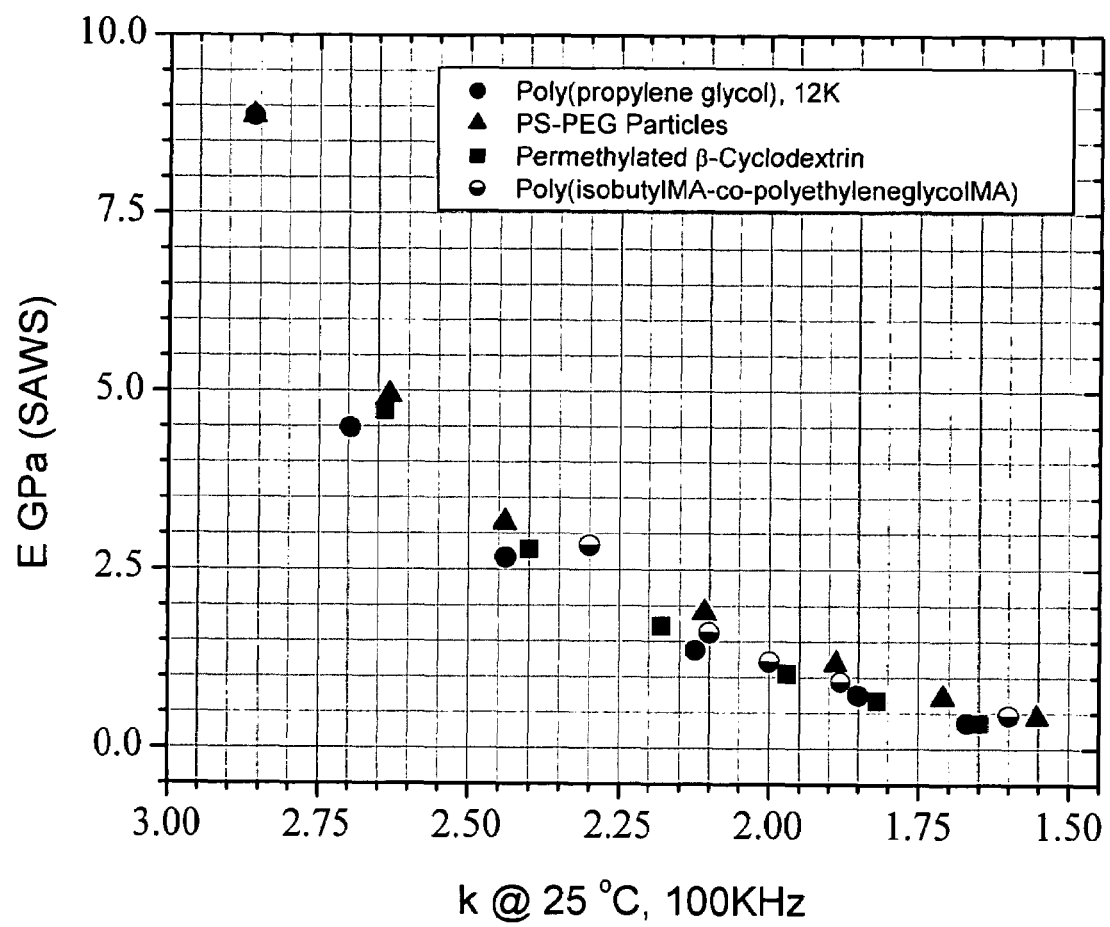
FIG. 1 is a plot depicting a relationship between Young's Modulus and dielectric constant as a function of porogen type and loading level.

It is understood that the references to the drawings herein are meant to be exemplary, and that neither the drawings themselves, nor any reference numerals on the drawings are meant to be limiting of the invention in any respect.

DETAILED DESCRIPTION OF THE INVENTION

FIG. 1 shows a typical relationship between the elastic modulus and the dielectric constant for a variety of porogens. The exponential-like behavior of the plots shows that the modulus is very sensitive to porogen loading level for dielectric constants <2.4. Normally this relationship mitigates the efficacy of high strength organosilicate resins where the initial matrix dielectric constant is >3.0. In general, increasing carbon content in the matrix resin will decrease the base dielectric constant of the dense matrix, but at the expense of mechanical properties. In comparing the modulii of thin film materials, it should be noted that those measured by nanoindentation (NI), a technique prone to substrate effects, often overestimate the value of the modulus, sometimes significantly. Surface acoustical wave spectroscopy (SAWS), a technique which is less dependent on film thickness and substrate effects, is also useful to estimate the value of film modulus. For purposes of comparison, modulus values determined by NI tend to be somewhat larger than those determined by SAWS. Throughout this disclosure, unless otherwise noted, modulus values were determined by SAWS.

Figure 2:
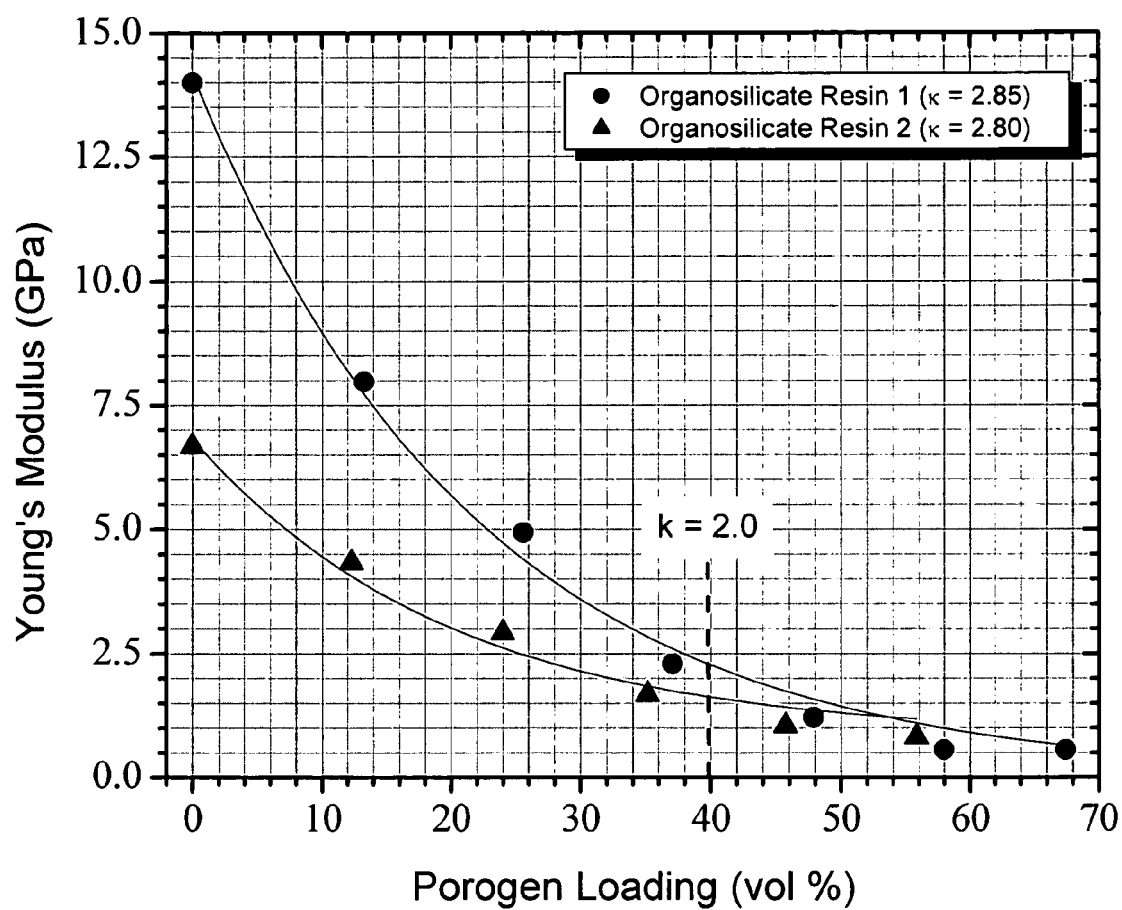
FIG. 2 is a graph depicting a typical known exponential relationship between Young's Modulus and porogen loading for two different organosilicate resins of comparable dielectric constants but different modulus values of the dense material.

By far, the majority of spin-on organosilicate dielectrics utilize silsesquioxanes $(RSiO_{1.5})_n$ as soluble thermosetting precursors both as homopolymers and as copolymers. High molecular weight particle-like polycondensates can generate porosity by packing leaving interstitial volumes. This is a viable approach for k>2.2 but fails to deliver lower dielectric constants with no porogen present. Porogen-based systems easily deliver dielectric constants <2.2, but these films have low cohesive energies and low elastic modulii (<2 GPa). When dense SSQ copolymers with elastic modulii >7 GPa were studied, the dielectric constants also increased, sometimes to >3.0. The steep profiles shown in FIGS. 1 and 2 marginalize the potential value of a higher initial film modulus, since more porogen must ultimately be added to reach the dielectric target. For systems like this, porogen volume fractions of at least 45% are often necessary to reach a dielectric target of 2.0.

Surprisingly, it has been discovered that dielectric films made from oxycarbosilanes and sacrificial porogens provide excellent dielectric characteristics without sacrificing mechanical properties. General details on the use of organic polysilica and sacrificial porogens to prepare porous dielectric films can be found in U.S. Pat. No. 5,895,263, the entire contents of which have already been incorporated herein by reference. In the present invention, the organic polysilica are oxycarbosilanes prepared from oxycarbosilane precursor monomers.

In general, a wide variety of oxycarbosilane precursor monomers may be utilized. The only limitation is that the selection lead ultimately to porous dielectric films exhibiting the target dielectric properties and mechanical properties of interest. Preferably, the porous dielectric films have a dielectric constant ranging from about 1.5 to about 2.4, preferably about 2.0 or about 1.8. Preferably, the porous dielectric films also have an elastic modulus measured by SAWS ranging from about 1 GPa to about 15 GPA, particularly preferably at least 2.5 GPa, and especially at least 3.5 GPa.

Suitable oxycarbosilanes include oxycarbosilanes made from oxycarbosilane precursor monomers comprising multiple silicon substituents with hydrolysable functionalities separated by aliphatic, aromatic or aryl/alkyl carbon bridges. Non-limiting examples of suitable oxycarbosilane precursor monomers include those mentioned below:

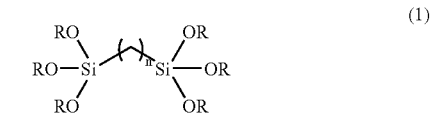

(1)

R = alkyl, preferably Me, Et
n = 1-10, preferably 1-4

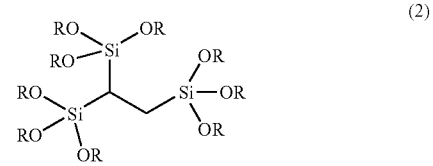

(2)

R = alkyl, preferably Me, Et

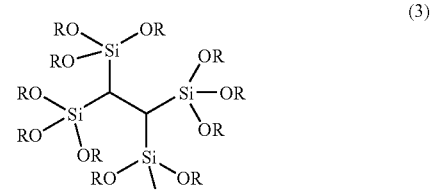

(3)

R = alkyl, preferably Me, Et

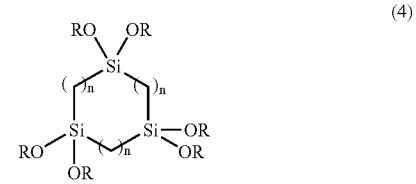

(4)

R = alkyl, preferably Me, Et
n = 1-2

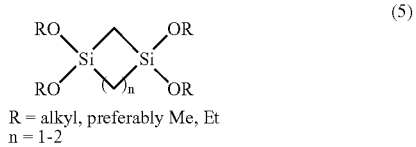

(5)

R = alkyl, preferably Me, Et
n = 1-2

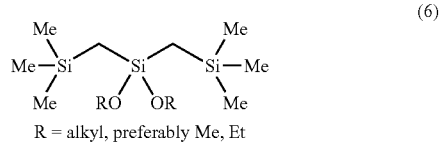

(6)

R = alkyl, preferably Me, Et

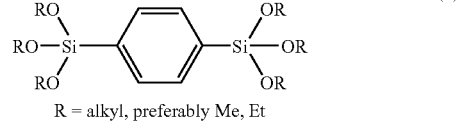

(7)

R = alkyl, preferably Me, Et

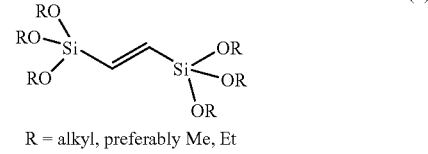

(8)

R = alkyl, preferably Me, Et

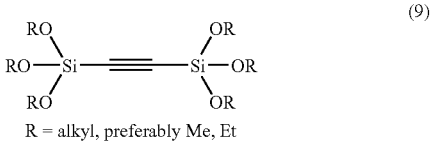

(9)

R = alkyl, preferably Me, Et

-continued

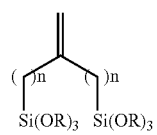

R = alkyl, preferably Me, Et
n = 0 - 3

(10)

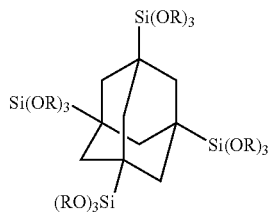

R = alkyl, preferably Me, Et (11)

These oxycarbosilane precursor monomers are well known, and, in many cases, commercially available, and/or can be prepared by or analogous to well known preparation schemes.

The oxycarbosilane may be prepared from one or more oxycarbosilane precursor monomers, or from a blend of one or more oxycarbosilane precursor monomers and one or more organic polysilica. In one preferred embodiment, the oxycarbosilane is a blend derived from mixing various oxycarbosilane monomers, or from mixing hydrolyzed oxycarbosilane monomers with hyperbranched or dendritic oxycarbosilane oligomers. In another preferred embodiment the oxycarbosilane precursors may be mixed with tetraethyl or tetramethyl orthosilicate prior to hydrolysis. In another preferred embodiment, the oxycarbosilane is a blend derived from mixing one or more oxycarbosilane monomers with one or more silsesquioxane (SSQ) polymers or SSQ precursor monomers. In yet another preferred embodiment, oxycarbosilane monomers are co-hydrolyzed with other organosilicate monomers of structure $R_2Si(OR')_2$, $RSi(OR')_3$, and/or $Si(OR')_4$, where R' is a short alkyl group (preferably 1–4 carbon atoms) and R are alkyl, aryl, or alkyl-aryl substituents The porogen is a decomposable polymer, many types of which are already well known in the art. Examples of suitable decomposable polymers are all these, and especially those mentioned in U.S. Pat. No. 5,895,263, the entire disclosure of which has already been incorporated herein by reference. In a particularly preferred embodiment, the decomposable polymer is a linear or branched polymer selected from the group consisting of polyesters, polylactides, polystyrenes substituted polystyrenes, poly-alpha methylstyrene, substituted poly-alpha methyl polystyrenes, aliphatic polyolefins, polynorbornenes, polyacrylates, polymethacrylates, and polyethers. Among the latter, particularly polyethylene oxide, polypropylene oxide and polytetrahydrofuran are preferred. The decomposable polymer is preferably hyperbranched, a linear di- or triblock copolymer, a radial block copolymer or a polymeric unimolecular amphiphile, U.S. Pat. No. 6,399,666, the entire contents of which are incorporated herein by reference. The decomposable polymer should be selected so as to be compatible with the dielectric material whether in solution or applied as a film.

The insulative matrix material of the present invention is prepared by combining the uncondensed or partially condensed dielectric oxycarbosilane material and the decomposable polymer. Preferably, the decomposable polymer is radiation decomposable or preferably thermally decomposable.

Details of the further processing are analogous to the processing protocol described in U.S. Pat. No. 5,895,263, the entire contents of which have already been incorporated herein by reference.

The insulative matrix material is applied to a substrate, for example, a suitable substrate for forming an integrated circuit, by procedures well known in the art. In a preferred embodiment, the insulative material is "spun on" to the substrate. In a preferred embodiment, the spinning solution is stable for at least 2 weeks at 5° C. as determined by the solution viscosity. In addition, the processed porous film should not show changes in film thickness, refractive index, dielectric constant and modulus over a similar time period.

The next step involves heating the insulative material to a temperature at which the dielectric oxycarbosilane condenses. The heat can be applied directly or in a step-wise fashion. The temperature selected will depend on the oxycarbosilane used, but should be below the thermal decomposition temperature of the decomposable polymer. In a preferred embodiment, the temperature is selected so that not only is condensation of the oxycarbosilane achieved, but also there is some cross-condensation with the reactive groups of the decomposable polymer, although porogen/matrix cross-condensation is not an essential feature of the process.

The third step of the processing involves decomposing the decomposable polymer and removing the remnants thereof so that pores are left in the condensed oxycarbosilane. As noted previously, the decomposable polymer is preferably susceptible to radiation or heat so that application of a sufficient amount of either will decompose the decomposable polymer.

The remnants of the decomposable polymer may be volatile, or else they may be removed by methods well known in the art. Preferably, the porogen is removed by solvent extraction with a suitable solvent, especially a supercritical fluid or a mixture of supercritical fluids, for example $SCCO_2$ containing methanol, ethanol, tetrahydrofuran, ethyl acetate and the like.

The removal of the remnants of the decomposed polymer leaves a layer of porous dielectric oxycarbosilane film material on the substrate. In a preferred embodiment, the pores of this film are nanosized, i.e., the film is "nanoporous." In especially preferred embodiments, the nanoporous film is thermally stable to at least 400° C., and/or absorbs <2% water when exposed to a relative humidity of 50% at 25° C. In another preferred embodiment, the nanoporous film is a high optical quality film formed by spin casting, and, preferably, does not exhibit striations especially when non-ionic surfactant leveling agents are added to the insulative matrix material in solution at a loading level of 1–5 weight percent based on the total weight of the solution.

Once the porous oxycarbosilane film layer has been produced, it is lithographically patterned; a metallic film layer is deposited onto the lithographically patterned porous oxycarbosilane film; and then the metal film is planarized to remove excess metal, all by procedures well known in the art, and described, for example, in U.S. Pat. No. 5,895,263.

The result is an integrated circuit characterized by excellent dielectric properties and also excellent mechanical properties.

The invention will now be described in even greater detail with reference to the following non-limiting examples.

EXAMPLES

A typical, non-limiting reaction and processing procedure for the formation of both dense and porous oxycarbosilane films is described below.

Preparation of Porous Oxycarbosilane Films. Thin films were prepared from freshly mixed hybrid solutions of bis (triethoxysilyl)methane (bis(tri-EOS)Me) [Formula (1) above, wherein n=1] and a triblock copolymer composed of ethylene oxide (EO) and propylene oxide (PO) of the following composition, $EO_{20}PO_{70}EO_{20}$, which is available from BASF under the tradename Pluronic P-123. Bis(tri-EOS)Me was obtained from Gelest and was diluted with 1-methoxy-2-propanol to yield a 30 wt. % solution. A typical triblock copolymer such as P-123 was obtained from BASF Corp. and was purified by ion exchange treatment and dissolved in propylene glycol methyl ether acetate (PG-MEA) to give a 26.42 wt. % solids solution. A scintillation vial was charged with 6.20 g of bis(tri-EOS)Me solution and 2.04 g of P-123 solution. To the mixture, 0.89 g of 0.33M HCl solution was added, and the resulting mixture was allowed to stand and hydrolyze for 15 min. without stirring to yield a homogenous solution. The hydrolyzed solution was transferred to a second scintillation vial charged with 0.044 g of FC4430 fluorosurfactant (3M Corporation), and shaken to give a clear homogenous solution. Thin films were obtained by spin casting the solution, which had been filtered through a 0.2 μm syringe filter onto clean wafers. The wafers were spun at 2500 rpm for 30 seconds. The films were cured from 50° C. to 100° C. with a ramp rate of 5° C./min. followed by a soak cure at 100° C. for 1 hour. The films were then subjected to a final cure temperature of 450° C. for 2 hours with a ramp from 100° C. to 450° C. at 5° C./min. All thermal treatments were done under a nitrogen environment.

Characterization. Film thicknesses and refractive indices were measured using a Filmetrics F20 spectral reflectometer. Dielectric constant values were measured using a capacitance bridge with an HP 4192A impedance analyzer using a metal-insulator-semi-conductor (MIS) structure. Film densities were obtained using a X-ray diffractometer (Panlytical, X-Pert pro MRD) with a ceramic X-ray tube. X-rays of the wavelength of 1.54 Å (Cu $K_\alpha$) were monochromated with a 4-bounce monochromator (Ge(220)). Elastic modulii were obtained both by nanoindentation (NI) and by using surface acoustic wave spectroscopy (SAWS). Nanoindentation was performed with the Nano Intender XP system outfitted with the Dynamic Contact Module. (DCM). The DCM provides an overall miniaturization of the XP system, making it more suitable to perform indentations in the low force ranges (0.01 mN to 12 mN). The Continuous Stiffness Measurement Option (CSM) was used. This technique superimposes a small oscillatory force to the indentation force and allows a continuous measurement of modulus and hardness during the indentation process. Tip calibration was based on the Oliver-Pharr method. Detection of the surface could be a problem: a stiffness change of 4 times was used as an indicator. Measurement was done with the constant strain rate option. Typical hardness vs. indentation depth normalized to film thickness shows, that modulii and hardness data measured at NI depths of 5% or less of the film thickness is a reasonable approach to avoid substrate effects. A minimum of 20 indents were done for each sample.

A second technique for determining the elastic modulus was performed using a laser-acoustic thin film analyzer (LaWave, Fraunhofer USA). Acoustic waves were generated by a nitrogen pulse laser (wavelength 337 nm, pulse duration 0.5 ns) and detected using a transducer employing a piezoelectric polymer film as a sensor. The measured surface wave velocity as a function of frequency was fitted with the theoretical dispersion curve to deduce Young's modulus. Poisson's ratio was assumed as 0.25.

Results. Initial studies on the hydrolysis of precursors produced surprising results. For example, the acidic hydrolysis of precursor 1 (n=1) in 1-methoxy-2-propanol followed by spin coating and curing to 450° C. gave a high optical quality film with a modulus (SAWS) of 22.76 GPa. Although HCl was used as a catalyst in the example, other acids such as nitric, sulfuric and phosphoric acid worked equally well. In addition, organic acids with $pK_a<5$ can be utilized. For comparison, the highest modulus for a dense organosilicate film, similarly cast and cured, measured in our hands was ~10 GPa. However, the dielectric constant of the cured, dense oxycarbosilane film was ~3.6, somewhat higher than that of cured high modulus organosilicate films (k=2.9–3.3). Surprisingly, the oxycarbosilanes proved to be excellent matrix materials in the presence of various porogens. In this regard, linear and branched poly(alkylene oxides), polymeric unimolecular amphiphiles, and various commercial non-ionic, polymeric surfactant molecules, e.g., Pluronics, Brij, etc., were all tried. Using Pluronics 123 at a loading level of ~20 wt % (based on monomer) dissolved in the hydrolysate from monomer 1 (n=1), porous films were obtained after curing to 450° C. with dielectric constants ranging from 2.0–2.2. Measured SAWS modulus numbers for these samples ranged from 6–8 GPa depending on the hydrolysis and processing conditions. The measured modulus numbers for this system are astonishingly high, ranging from 4–6× those of porous organosilicate derivatives with similar k values. These numbers are the highest by far of any that we have observed for porous films generated using the sacrificial porogen route. The measured numbers derived for films generated from samples prepared under various reaction conditions are shown in Table 1 together with data from various porogen-based organosilicate materials. The organosilicate resin was primarily methyl silsesquioxane containing approximately 20–30% Q branches. The modulus numbers for the oxycarbosilanes are exceptionally high and represent values which have not been enhanced by e-beam or UV curing. It is clear that the porous oxycarbosilane numbers substantially exceed those of the best porous SSQ samples at comparable k values. This is true even after enhancement by UV curing for the latter, which typically increases the modulus values by 50–100%. The films after curing are optically clear and stable to >450° C. suggesting the presence of nanoscopic porosity, a feature confirmed by electron microscopy.

TABLE 1

Characterization Data

| RESIN | POROGEN | POROGEN LOAD (wt %) | REFRACTIVE INDEX | DENSITY (g/cm$^3$) | $E_{SAWS}$ (GPa) | k @ 25° C. 100 KHz |
|---|---|---|---|---|---|---|
| Organosilicate Resin | None | 0 | 1.3596 | 1.3884 | 8.86 | 2.86 |
| Organosilicate Resin | 12K PPG | 10 | 1.3245 | 1.2043 | 4.48 | 2.7 |
| Organosilicate Resin | 12K PPG | 20 | 1.2746 | 1.0449 | 2.67 | 2.44 |
| Organosilicate Resin | 12K PPG | 30 | 1.2256 | 0.8492 | 1.37 | 2.12 |
| Organosilicate Resin | 12K PPG | 40 | 1.1791 | 0.6971 | 0.75 | 1.85 |
| Organosilicate Resin | 12K PPG | 50 | 1.1383 | 0.56058 | 0.36 | 1.67 |
| Organosilicate Resin | PS-PEG | 10 | 1.3165 | 1.1866 | 4.94 | 2.63 |
| Organosilicate Resin | PS-PEG | 20 | 1.2757 | 1.0288 | 3.16 | 2.44 |
| Organosilicate Resin | PS-PEG | 30 | 1.2342 | 0.8651 | 1.90 | 2.11 |
| Organosilicate Resin | PS-PEG | 40 | 1.1935 | 0.7137 | 1.19 | 1.89 |
| Organosilicate Resin | PS-PEG | 50 | 1.1568 | 0.5837 | 0.71 | 1.71 |
| Organosilicate Resin | PS-PEG | 60 | 1.1259 | 0.464 | 0.44 | 1.55 |
| Bis(tri-EOS)Me | None | 0 | 1.4482 | 1.548 | 22.76 | 3.61 |
| Bis(tri-EOS)Me | P-123 | 5 | 1.3701 | 1.300 | 13.09 | 2.97 |
| Bis(tri-EOS)Me | P-123 | 10 | 1.3174 | 1.126 | 9.99 | 2.69 |
| Bis(tri-EOS)Me | P-123 | 20 | 1.2303 | 0.826 | 6.40 | 2.05 |
| Bis(tri-EOS)Me | P-123 | 22.5 | 1.2156 | 0.774 | 5.54 | 1.98 |
| Bis(tri-EOS)Me | P-123 | 25 | 1.2026 | 0.719 | 3.78 | 1.88 |
| Bis(tri-EOS)Me | P-123 | 27.5 | 1.1905 | 0.674 | 2.51 | 1.82 |

Table 2 shows the stability of the bis(tri-EOS)Me hydrolysed solutions before spinning for different loadings of P-123 porogen.

TABLE 2

Shelf-Life Stability

| POROGEN LOADING | TIME ELAPSED BEFORE SPINNING | RI | t (nm) | $E_{SAWS}$ (GPa) | $E_{NANO}$ (GPa) |
|---|---|---|---|---|---|
| 20 Wt. % | 15 min | 1.2406 | 565 | 6.40 | 6.37 |
| (k = 2.05) | 1 week | 1.2452 | 571 | 5.15 | 6.26 |
|  | 2 weeks | 1.2390 | 618 | 5.03 | — |
| 22.5 Wt. % | 15 min | 1.2151 | 591 | 5.54 | 4.88 |
| (k = 1.98) | 1 week | 1.2189 | 599 | 4.23 | 4.87 |
|  | 2 weeks | 1.2193 | 640 | 4.35 | — |

The inventive integrated circuit can be used in any suitable electronic device, non-limiting examples of which are computers, radios, automobiles, DVD recorders/players, CD recorders/players, airplanes, etc.

It should be understood that numerous changes to the disclosed embodiment(s) can be made in accordance with the disclosure herein without departing from the spirit or scope of the invention. The preceding description, therefore, is not meant to limit the scope of the invention in any respect. Rather, the scope of the invention is to be determined only by the appended issued claims and their equivalents.

What is claimed is:

1. An integrated circuit comprising:
   a) a substrate;
   b) a lithographically patterned single layer porous dielectric oxycarbosilane surface film layer on said substrate wherein the film layer has a dielectric constant of about 1.5 to about 2.4 and a Young's modulus of at least 2.0 GPa; and
   c) a planarized metallic film on said surface layer.

2. The integrated circuit according to claim 1, wherein the dielectric oxycarbosilane is prepared from an oxycarbosilane monomer comprising multiple hydrolysable silicon substituents separated by aliphatic, aromatic or aryl/alkyl carbon bridging substituents.

3. The integrated circuit according to claim 1, wherein the dielectric oxycarbosilane is a copolymer derived from the hydrolysis of various oxycarbosilane monomers.

4. The integrated circuit according to claim 1, wherein the dielectric oxycarbosilane is a blend derived from mixing hydrolyzed oxycarbosilane monomers with at least one organosilicate polymer.

5. The integrated circuit according to claim 1, wherein the dielectric oxycarbosilane is a mixture derived from the co-hydrolysis of bridged carbosilane monomers with various other hydrolysable organosilicate monomers of structure $R_2Si(OR')_2$, $RSi(OR')_3$ and/or $Si(OR')_4$; where R is a short alkyl chain and R' is an alkyl, aryl or alkyl-aryl substituent.

6. The integrated circuit according to claim 1, wherein the dielectric oxycarbosilane(s) is a blend derived from mixing hydrolyzed oxycarbosilane monomers with hyperbranched or dendritic oxycarbosilane oligomers.

7. The integrated circuit according to claim 1, wherein the dielectric oxycarbosilane is prepared from at least one monomer selected from the group consisting of monomers of the formula:

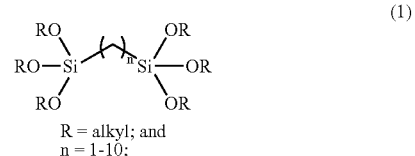

R = alkyl; and
n = 1-10;

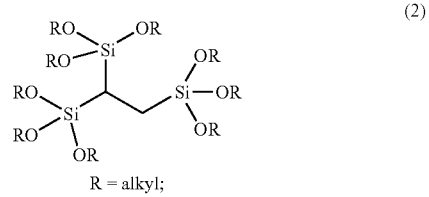

R = alkyl;

-continued (3)
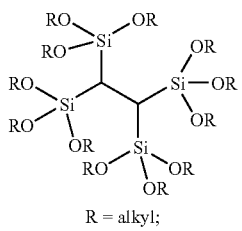
R = alkyl;

(4)
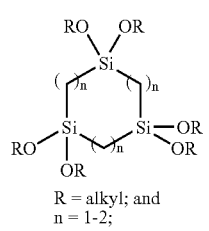
R = alkyl; and
n = 1-2;

(5)
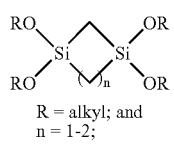
R = alkyl; and
n = 1-2;

(6)
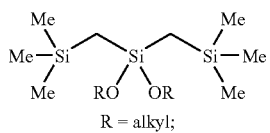
R = alkyl;

(7)
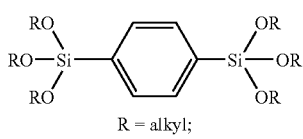
R = alkyl;

(8)
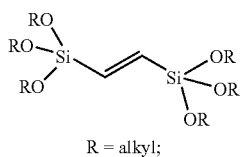
R = alkyl;

(9)
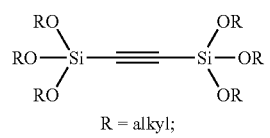
R = alkyl;

(10)
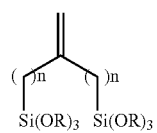
R = alkyl; and
n = 0-3; and

-continued

(11)
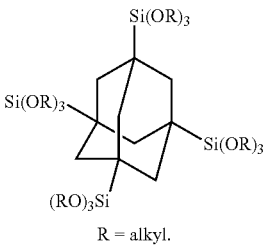
R = alkyl.

8. The integrated circuit according to claim 1, wherein the dielectric oxycarbosilane is prepared from bis(triethoxysilyl)methane.

9. An electronics device comprising an integrated circuit according to claim 1.

10. The electronics device according to claim 9, which is a computer.

11. A process for forming an integrated circuit, said process comprising the following steps:
   a) positioning on a substrate a layer of an insulative matrix material precursor composition, said precursor composition comprising:
      i) a dielectric material formed of an oxycarbosilane; and
      ii) a porogen comprising a decomposable polymer;
   b) heating the precursor composition to condense the oxycarbosilane;
   c) decomposing the decomposable polymer to form a condensed single layer porous dielectric material film layer;
   d) lithographically patterning the dielectric material film layer to form a patterned surface layer;
   e) depositing a metallic film onto the patterned surface layer; and
   f) planarizing the metallic film to form the integrated circuit.

12. The process according to claim 11, wherein the oxycarbosilane is prepared from an oxycarbosilane monomer comprising multiple silicon substituents with hydrolysable functionalities separated by aliphatic, aromatic or aryl/alkyl carbon bridges.

13. The process according to claim 11, wherein the oxycarbosilane is a homopolymer or copolymer derived from the hydrolysis of various oxycarbosilane monomers.

14. The process according to claim 11, wherein oxycarbosilane monomers are co-hydrolyzed with other organosilicate monomers of structure $R_2Si(OR')_2$, $RSi(OR')_3$ and/or $Si(OR')_4$, where R' is a short alkyl group and R are alkyl, aryl, or alkyl-aryl substituents.

15. The process according to claim 11, wherein the oxycarbosilane is a blend derived from mixing hydrolyzed oxycarbosilane monomers with at least one organosilicate polymer.

16. The process according to claim 11, wherein the oxycarbosilane is a blend derived from mixing hydrolyzed oxycarbosilane monomers with hyperbranched or dendritic oxycarbosilane oligomers.

17. The process according to claim 11, wherein the oxycarbosilane is prepared from at least one monomer selected from the group consisting of monomers of the formula:

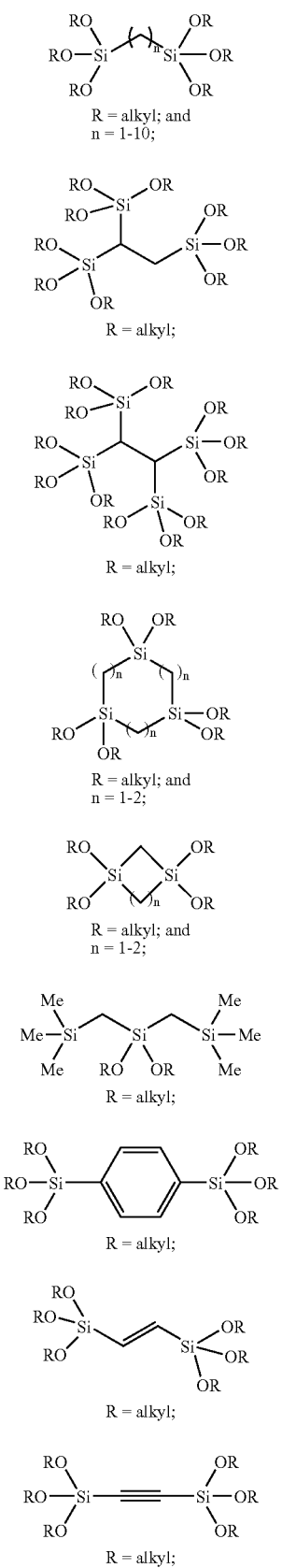

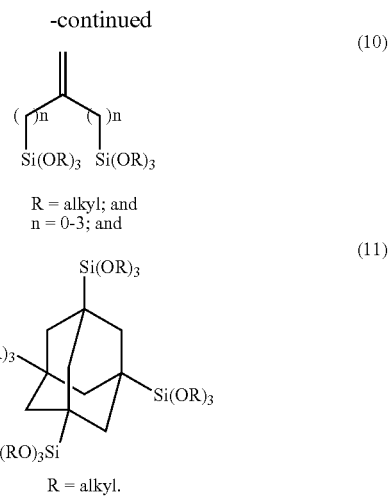

18. The process according to claim 11, wherein the oxycarbosilane is prepared from bis(triethoxysilyl)methane.

19. The process according to claim 11, wherein the decomposable polymer is decomposed by heating or exposure to radiation.

20. The process according to claim 11, wherein the decomposable polymer or remnants thereof are removed by solvent extraction.

21. The process according to claim 11, wherein the decomposable polymer or remnants thereof are removed by extraction with at least one supercritical fluid.

22. The process according to claim 11, wherein the decomposable polymer or remnants thereof are removed by extraction with a mixture of supercritical fluid and solvent.

23. The process according to claim 11, wherein the decomposable polymer is a linear or branched polymer selected from the group consisting of polyesters, polylactides, polystyrenes, substituted polystyrenes, poly-alpha methyl styrenes, substituted poly-alpha methyl styrenes, aliphatic olefins, polynorbornenes, polyacrylates, polymethacrylates and aliphatic polyethers.

24. The process according to claim 11, wherein the aliphatic polyethers are selected from the group consisting of polyethylene oxide, polypropylene oxide and polytetrahydrofuran.

25. The process according to claim 11, wherein the decomposable polymer is hyperbranched.

26. The process according to claim 11, wherein the decomposable polymer is a linear di- or triblock copolymer.

27. The process according to claim 11, wherein the decomposable polymer is a radial block copolymer.

28. The process according to claim 11, wherein the decomposable polymer is a polymeric unimolecular amphiphile.

29. The process according to claim 11, wherein the dielectric material film layer has a dielectric constant of 2.0 with a Young's modulus of at least 3.0 GPa.

30. The process according to claim 11, wherein the dielectric material film layer has a dielectric constant of 1.8 with a Young's modulus of at least 2.0 GPa.

31. The process according to claim 11, wherein the dielectric material film layer is nanoporous.

32. The process according to claim 11, wherein the dielectric material film layer is stable to at least 400° C.

33. The process according to claim 11, wherein the dielectric material film layer absorbs <2% water when exposed to a relative humidity of 50%.

34. An insulative matrix material useful in microcircuit applications, said material comprising:
   a) a dielectric material formed of an oxycarbosilane; and
   b) a decomposable polymer; wherein, upon heating, said dielectric material condenses and said decomposable polymer decomposes and leaves a plurality of pores in the single layer condensed dielectric material and wherein the condensed dielectric material has a dielectric constant of about 1.5 to about 2.4 and a Young's modulus of at least 2.0 GPa.

35. The insulative matrix material according to claim 34, wherein the oxycarbosilane is prepared from an oxycarbosilane monomer comprising multiple silicon substituents containing hydrolysable functionalities, separated by aliphatic, aromatic or aryl/alkyl carbon bridges.

36. The insulative matrix material according to claim 34, wherein the oxycarbosilane is a copolymer derived from the hydrolysis of various oxycarbosilane monomers.

37. The insulative matrix material according to claim 34, wherein the oxycarbosilane is a blend derived from mixing hydrolyzed oxycarbosilane monomers with at least one organosilicate polymer.

38. The insulative matrix material according to claim 34, wherein oxycarbosilane monomers are co-hydrolyzed with other organosilicate monomers of structure $R_2Si(OR')_2$, $RSi(OR')_3$ and/or $Si(OR')_4$, where R' is a short alkyl group and R are alkyl, aryl, or alkyl-aryl substituents.

39. The insulative matrix material according to claim 34, wherein the oxycarbosilane is a blend derived from mixing hydrolyzed oxycarbosilane monomers with hyperbranched or dendritic oxycarbasilane oligomers.

40. The insulative matrix material according to claim 34, wherein the oxycarbosilane is prepared from at least one monomer selected from the group consisting of monomers of the formula:

(1)
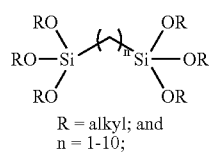
R = alkyl; and
n = 1-10;

(2)
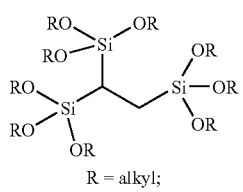
R = alkyl;

(3)
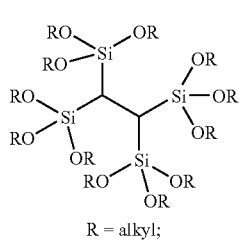
R = alkyl;

-continued (4)
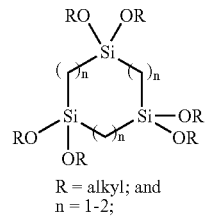
R = alkyl; and
n = 1-2;

(5)
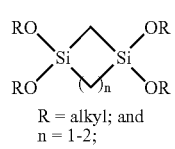
R = alkyl; and
n = 1-2;

(6)
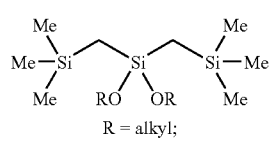
R = alkyl;

(7)
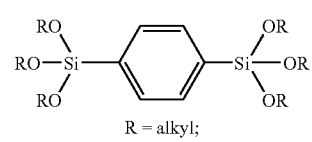
R = alkyl;

(8)
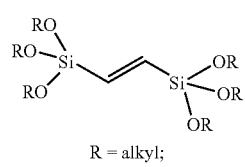
R = alkyl;

(9)
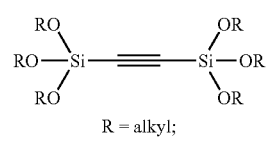
R = alkyl;

(10)
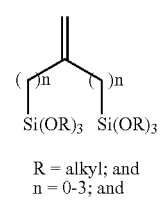
R = alkyl; and
n = 0-3; and

(11)
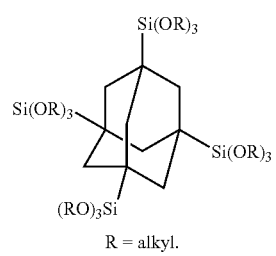
R = alkyl.

41. The insulative matrix material according to claim 34, wherein the oxycarbosilane is prepared from bis(triethoxysilyl)methane.

42. The insulative matrix material according to claim 34, wherein the decomposable polymer is a linear or branched polymer selected from the group consisting of polyesters, polylactides, polystyrenes, substituted polystyrenes, poly-alpha methyl styrenes, substituted poly-alpha methyl styrenes, aliphatic olefins, polynorbornenes, polyacrylates, polymethacrylates and aliphatic polyethers.

43. The insulative matrix material according to claim 34, wherein the aliphatic polyethers are selected from the group consisting of polyethylene oxide, polypropylene oxide and polytetrahydrofuran.

44. The insulative matrix material according to claim 34, wherein the decomposable polymer is hyperbranched.

45. The insulative matrix material according to claim 34, wherein the decomposable polymer is a linear di- or triblock copolymer.

46. The insulative matrix material according to claim 34, wherein the decomposable polymer is a radial block copolymer.

47. The insulative matrix material according to claim 34, wherein the decomposable polymer is a polymeric unimolecular amphiphile.

* * * * *